United States Patent [19]
McClure

[11] Patent Number: 5,619,462
[45] Date of Patent: Apr. 8, 1997

[54] FAULT DETECTION FOR ENTIRE WAFER STRESS TEST

[75] Inventor: David C. McClure, Carrollton, Tex.

[73] Assignee: SGS-Thomson Microelectronics, Inc., Carrollton, Tex.

[21] Appl. No.: 509,158

[22] Filed: Jul. 31, 1995

[51] Int. Cl.$^6$ .................................................. G11C 29/00
[52] U.S. Cl. ........................... 365/201; 365/226; 257/48
[58] Field of Search .................................. 365/200, 201, 365/226; 371/21.1, 21.4; 257/48

[56] References Cited

U.S. PATENT DOCUMENTS

| | | | |
|---|---|---|---|
| 5,053,700 | 10/1991 | Parrish | 324/158 R |
| 5,059,899 | 10/1991 | Farnworth et al. | 324/158 R |
| 5,241,266 | 8/1993 | Ahmad et al. | 324/158 R |
| 5,339,277 | 8/1994 | McClure | 365/230.08 |
| 5,341,336 | 8/1994 | McClure | 365/201 |
| 5,446,395 | 8/1995 | Goto | 324/763 |

*Primary Examiner*—Tan T. Nguyen
*Attorney, Agent, or Firm*—Theodore E. Galanthay; Lisa K. Jorgenson; Irena Lager

[57] ABSTRACT

A circuit and related method are provided for parallel stressing of a plurality of memory circuits integrated on dies on a silicon wafer. On each die, a test mode control circuit, having a first and a second test mode control inputs, and a test enable circuit, having a first and a second test enable inputs, are used to enable test operation mode and to force outputs of address buffers, data buffers and other signal buffers, like chip-enable or write buffers, to predetermined logic values so that all row and column decoders are selected and predetermined data is written into the memory cells. Contemporaneously are also exercised entire paths of buffers. The silicon wafer is then heated and maintained at an elevated temperature for a desired time, and then cooled down. In this way it is possible to stress test for ionic contamination, trap sites and weak oxides a plurality of integrated circuits on the same wafer in a short time, requiring only a limited number of test signals. During the test the current consumed by each die is monitored and, if a high current is consumed by one die, that die is isolated from the array of dies by controlling the test enable signals present in each row and column of the array. This circuit allows a parallel testing of a plurality of integrated circuits on a single wafer, reduces dramatically test times and avoids consequent burn in of packaged devices.

39 Claims, 8 Drawing Sheets

FAULT DETECTION FOR ENTIRE WAFER STRESS TEST

BACKGROUND OF THE INVENTION

1. Field of the invention

The present invention relates to the testing of memory devices and more particularly to the testing of static random access memory (SRAM) devices, first-in first-out (FIFO) memory devices, and other memories incorporated in integrated circuits.

2. Description of the Prior Art

The premature or infant failure of memory cells in integrated SRAMs, multiple port memories, FIFO memories and other memory products has been an unfortunate but all too common occurrence. Moreover, failure of such parts in the field is unacceptable to vendors of products incorporating integrated circuit memory. As a result, nondestructive testing of all integrated circuits to expose and detect that integrated circuits subject to infant failure is dictated by the market.

One contemporary testing regimen is to place memory devices into burn in oven, elevating the device temperature, and then exercising the devices by applying nominal or stress voltages to the product. For some large capacity memory devices the period in the burn in oven has reached 96 hours, in order to stress each of over one thousand wordlines and millions of memory cells. Such long burn-in cycles pose an obvious bottleneck to production, and are useless for generating up to the minute information about possible faults in the manufacturing process. An accelerated stress mode that eliminates this bottleneck without damaging good memory product would have apparent benefits.

For some test or operating modes of the memory array, selection of all or a portion of row and/or bit lines at a single time is desirable. An example of a test mode where selecting all or a portion of the row and bit lines at a single time is used is described in co-pending U.S. patent application Ser. No. 07/954,276, entitled *Stress Test For Memory Arrays In Integrated Circuits*, filed Sep. 30, 1992, assigned to SGS THOMSON Microelectronics, Inc. and incorporated herein by this reference. A plurality of rows is selected at one time and a stress voltage is placed on a plurality of bit and complementary bit lines. In this manner the memory cells within the memory array are stress tested in order to detect latent defects.

Another example of test mode, where selecting all the row and bit lines at a single time is used, is described in U.S. Pat. No. 5,341,336 entitled *Method For Stress Testing Decoders And Periphery Circuits*, assigned to SGS THOMSON Microelectronics, Inc. and incorporated herein by this reference. A plurality of rows and bit lines are selected or deselected simultaneously and a stress voltage is applied to the integrated circuit. In this manner latent defects within decoders and periphery circuits can be detected.

A circuit that allows for the simultaneous selection or deselection of a plurality of rows and columns within a memory array is described in U.S. Pat. No. 5,339,277 entitled *Address Buffer*, assigned to SGS THOMSON Microelectronics, Inc. and incorporated herein by this reference. A first and a second circuit generate a true and a complementary signal, respectively, during normal operations of the integrated circuit. When desired the first and second circuits may be used to generate two signals of the same voltage level. The two signals of the same voltage level may then be used by an address decoder to simultaneously select or deselect a plurality of rows and/or columns within a memory array.

The increasing complexity of the memory devices is also increasing the number of signal lines that must be controlled during the test and consequently the complexity and the cost of test equipment.

Therefore, it would be desirable to provide a circuit and a method for stress testing integrated memory circuits at wafer level that allows parallel testing of a plurality of integrated circuit dies on a single wafer.

In light of the above, it is an object of the present invention to provide a test circuit that permits parallel testing of a multiplicity of dies on a wafer (e.g. 600 dies/wafer) at the same time and that allows, during the test process, to reveal and discard from the test those dies which go into high current mode. Such a circuit and method would permit at least 600X reduction in test time and also avoid consequent burn in oven insertion of packaged devices, resulting in an important decrease of the test time and of the complexity of test probes and test equipment and verifying reliability of bare silicon dies.

SUMMARY OF THE INVENTION

A circuit and related method are provided for parallel stressing of a plurality of memory circuits integrated on dies on a silicon wafer. On each die, a test mode control circuit, having a first and a second test mode control inputs, and a test enable circuit, having a first and a second test enable inputs, are used to enable test operation mode and to force outputs of address buffers, data buffers and other signal buffers, like chip-enable or write buffers, to predetermined logic values so that all row and column decoders are selected and predetermined data is written into the memory cells. Entire paths of buffer are also contemporary exercised. The silicon wafer is then heated and maintained at an elevated temperature for a desired time, and then cooled down. In this way it is possible to stress test for ionic contamination, trap sites and weak oxides over a plurality of integrated circuits on the same wafer in a short time, requiring only a limited number of test signals. During the test the current consumed by each die is monitored and, if a high current is consumed by one die, that die is isolated from the array of dies by controlling the test enable signals present in each row and column of the array. This circuit allows parallel stress and test of a plurality of integrated circuits on a single wafer, dramatically reducing test times and avoiding consequent burn in of packaged devices.

The characteristics and advantages of the circuit in accordance with the present invention are set forth in the description of an embodiment thereof given below by way of non-limiting example with reference to the annexed drawings.

DETAILED DESCRIPTION OF THE PREFERRED EMBODIMENT

Figure 1:
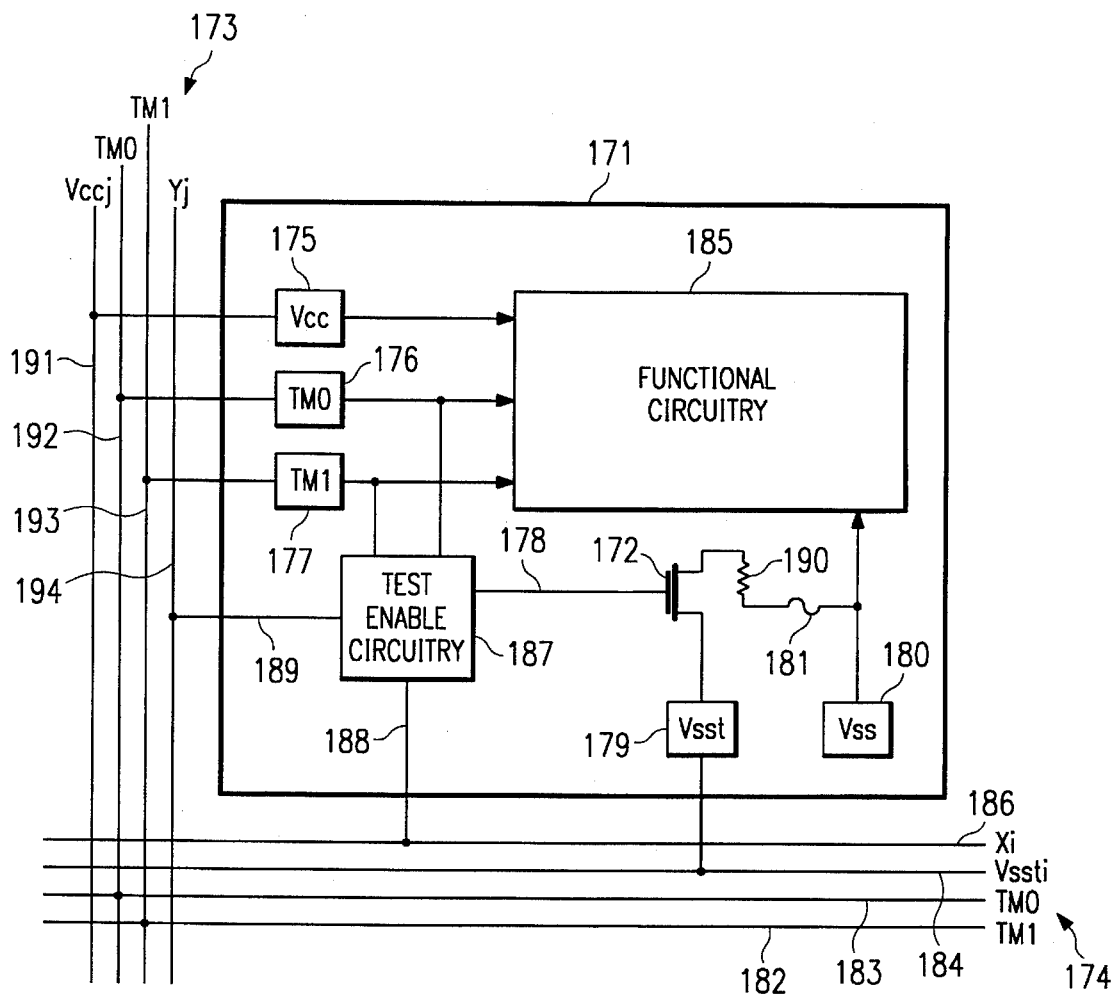
FIG. 1 is an integrated memory circuit according a first embodiment of to the present invention.

FIG. 1 shows an integrated circuit die 171 in its form when present on a wafer of semiconducting material. On the wafer, near the die 171, are present conducting line buses 173 and 174, running in the "scribe line" adjacent to the die, each bus 173, 174 having conducting lines connected to input pads 175, 176, 177 and 179 present on the die 171. Die 171 also includes functional part 185 of the circuit which, according to this example, is a memory circuit such as a static random access memory (SRAM). Die 171 also includes a test enable circuitry 187 connected to external conducting lines and coupled to the functional circuitry 185.

A first input pad 175, labeled Vcc in FIG. 1, is connected to a first vertical conducting line 191, labeled Vccj, and supplies the Vcc voltage to functional circuitry 185. A second 176 and a third 177 input pads, labeled TM0 and TM1 in FIG. 1, are connected respectively to a second 192 and to a third 193 vertical conducting lines and to internal circuitry 185. Pads 176 and 177 are also connected to a first and a second input of the test enable circuitry 187. A third and a fourth input, 188 and 189, of the test enable circuitry 187 are connected respectively to a first horizontal conducting line 186, labeled Xi, and to a fourth vertical conducting line 194, labeled Yj. One output 178 of the test enable circuitry 187 is connected to control terminal of an n-channel switching transistor 172. Source terminal of transistor 172 is connected to input pad 179, labeled Vsst, which is connected to a second horizontal conducting line 184, labeled Vssti. Drain terminal of transistor 172 is coupled, by means of a serial connection of a resistor 190 and a fuse 181, to input pad 180, labeled Vss, which supplies the Vss voltage to internal circuitry 185 during normal operation of the integrated circuit.

The following table shows the possible status of the two test mode input signals TM0 and TM1 and the corresponding conditions of functional circuitry 185:

| TM0 | TM1 | Status |
|---|---|---|
| 0 | 0 | Test (deselect all array) |
| 0 | 1 | Test (Write all 1's) |
| 1 | 0 | Test (Write all 0's) |
| 1 | 1 | Normal operation |

As can be seen, during the normal operation mode the TM0 and TM1 signals must be maintained high. If at least one of these two signals is low the integrated circuit enters a special test mode operation. There are three different test modes. If TM0 is low and TM1 is high, all row and column decoders are selected and the entire array of cells is written with 1's; if TM0 is high and TM1 is low, all row and column decoders are selected and the entire array of cells is written with 0's; finally, if both TM0 and TM1 are low, all row and column decoders are deselected.

In operation, the output of the test enable circuitry 187 is at a high level when at least one of the two test mode input signals TM0 and TM1 is low and when at least one of the two test enable signals Xi and Yj is high. In this condition the switch transistor 172 is on and the supply voltage Vssti, applied to pad 179 through the conductive line 184, reaches the pad 180 and the internal circuitry 185. If both test mode input signals TM0 and TM1 are high, in normal operation mode, the switch transistor 172 is off and pad 180 is electrically isolated from pad 179. In this condition, in fact, the memory circuit is supplied by the Vss pad 180 and the Vsst pad 179 must be isolated from the circuitry.

The integrated circuit of FIG. 1 is integrated on a n-type silicon substrate. Normally, a n-type substrate is connected to Vcc voltage, which is a positive voltage. The substrate type determines which power supply, Vcc or Vss, must be switched by the switch transistor because, during scribing of single dies from the wafer, part of connective lines that run in the "scribe line" may be shorted to the substrate. If, for example, the n-type substrate is normally connected to Vcc, the input pad that in normal operation supplies the circuit with the Vss voltage must not be shorted to Vcc, or catastrophic failure may result. According to this embodiment of the invention, the Vss pad 180, as can be seen in FIG. 1, is disconnected during normal operation from the Vsst pad connected to conductive line 184, by means of the switching transistor 172. For the same reason the normal operation mode of the integrated circuit has been chosen corresponding to high logic levels on both the two test mode input signals TM0 and TM1. This assures that an eventual short circuit between any of the conductive lines and the substrate will not jeopardize normal operation of the integrated circuit.

Fuse 181 allows a faulty die to be isolated from other dies on the wafer, during a brief testing of each die before starting first phase of the parallel test of all dies. In fact at the beginning each die is first tested individually (or a few at a time) in the test modes to verify they operate correctly with no high current or short circuits. If a high current path is found on a die, its fuse 181 is blown and the integrated circuit on that die is disconnected from other dies on the wafer.

Resistor 190 is preferably a low value resistor placed in series with the power supply Vsst, for limiting the maximum current consumed by the die in the case that the die goes into a high current mode during the test. This resistor can limit the current to, as an example, 30 mA.

Figure 2:
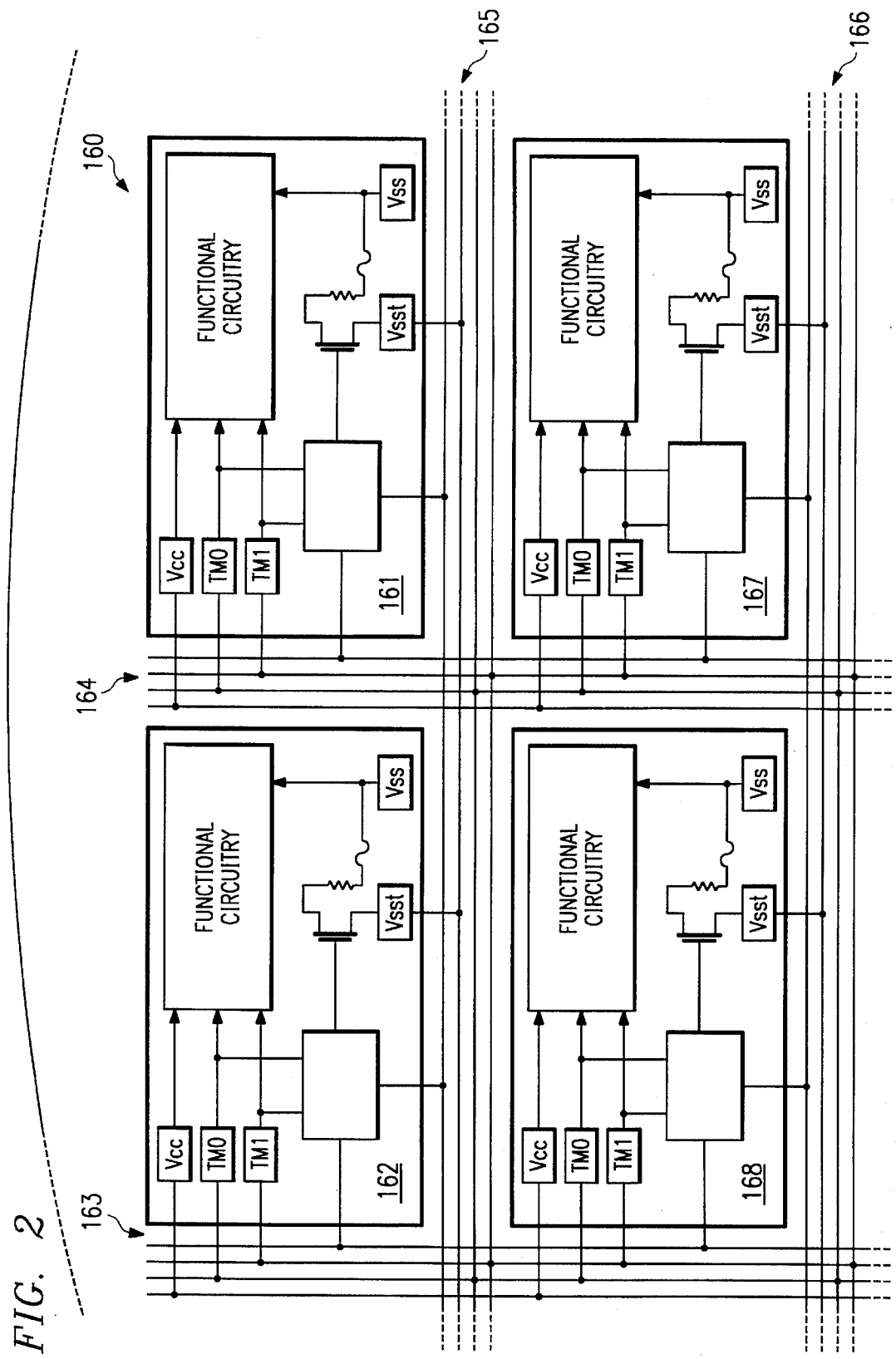
FIG. 2 shows part of a silicon wafer on which are integrated a plurality of integrated memory circuits according to the present invention.

FIG. 2 shows part of silicon wafer 160 on which are integrated a plurality of integrated circuit dies according to the present invention. In FIG. 2, four integrated circuit dies 161, 162, 167 and 168, and conductive buses running horizontally, 165 and 166, and vertically, 163 and 164, between the integrated circuit dies, are shown. These lines within the conductive buses are used, during test of integrated circuits at wafer level, to connect in parallel corresponding inputs of a plurality of integrated circuit dies on the same row, on the same column, or on the entire wafer. As noted above, the conductive lines of buses 163, 164, 165, 166 are placed in the "scribe line" present on the wafer between adjacent dies. When dies are scribed at the end of the test, these conductive lines are automatically eliminated. Through these conductive lines it is possible, during the wafer level stress test, to control the operation of some or all dies on the wafer to parallel stress multiple dies on the wafer.

In this embodiment horizontal and vertical buses 163, 164, 165, 166 each contain four conductive lines. Two horizontal lines, carrying the signals TM0 and TM1, are connected to two correspondent vertical lines in each crossing (see FIG. 1), so that these two signals are supplied simultaneously to every die on the wafer. Each horizontal bus 165, 166 has a separate test power supply line, shown in FIG. 1 as Vssti for the generic "ith" row of dies, and each vertical bus 163, 164 has a separate power supply line, shown in FIG. 1 as Vccj for the "jth" column of dies. In this way each die is supplied by a unique combination of Vccj and Vssti, making it possible to monitor the current consumed by individual dies during the test. Test operation of each single die is also enabled by the selection of horizontal Xi and vertical Yj test enable signals running, respectively in the horizontal and vertical scribe lines. If it happens that, during the test, the die in row i and column j goes into a high current mode, this fault situation can be revealed by an increased current between supply lines Vssti and Vccj. The faulty die can then be disconnected from the other dies on the wafer by lowering the two correspondent row and columns test enable signals Xi and Yj.

Figure 3:
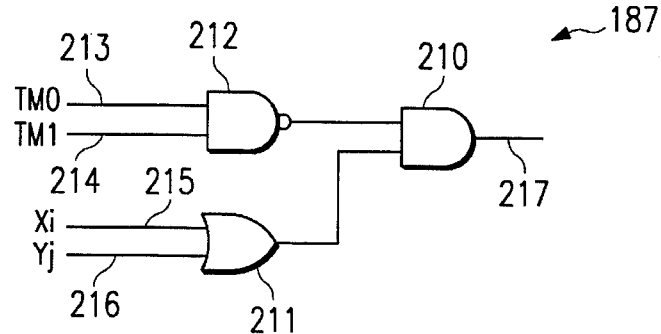
FIG. 3 is an electrical diagram, in schematic form, of a test enable circuitry used in the integrated memory circuit of FIG. 1.

FIG. 3 is an electrical diagram, in schematic form, of the preferred test enable circuitry 187 used in the integrated memory circuit 171 of FIG. 1. This logic circuit has four inputs and one output. A first input 213 and a second input 214, upon which are applied the two test mode control signals TM0 and TM1, respectively, are connected to a first and a second input of a NAND gate 212, whose output is connected to a first input of an AND gate 210. A third 215 and a fourth 216 input of the test enable circuitry 187, on which are applied the first Xi and the second Yn test enable input signals, are connected respectively to a first and to a second input of an OR gate 211, whose output is connected to a second input of the AND gate 210. The output of the AND gate 210 is the output 217 of the test enable circuitry 187. In operation, the output of the test enable circuitry 187 is at a high level when at least one of the two test mode input signals TM0 and TM1 is low and when at least one of the two test enable signals Xi and Yj is high.

The circuit of FIG. 3, in combination with the switching transistor 172 connected to its output, permits a single die to be disconnected, by the signals Xi and Yj going low, from the other dies currently under test on the wafer in case that a high current path is revealed in that particular die.

If multiple dies on multiple rows and columns of the wafer have high current, additional dies beyond the faulty dies may be disabled. While this may not be a problem, a more exacting way to identify and disable the high current die is explained below with reference to FIGS. 4, 5, 6 and 7.

Figure 4:
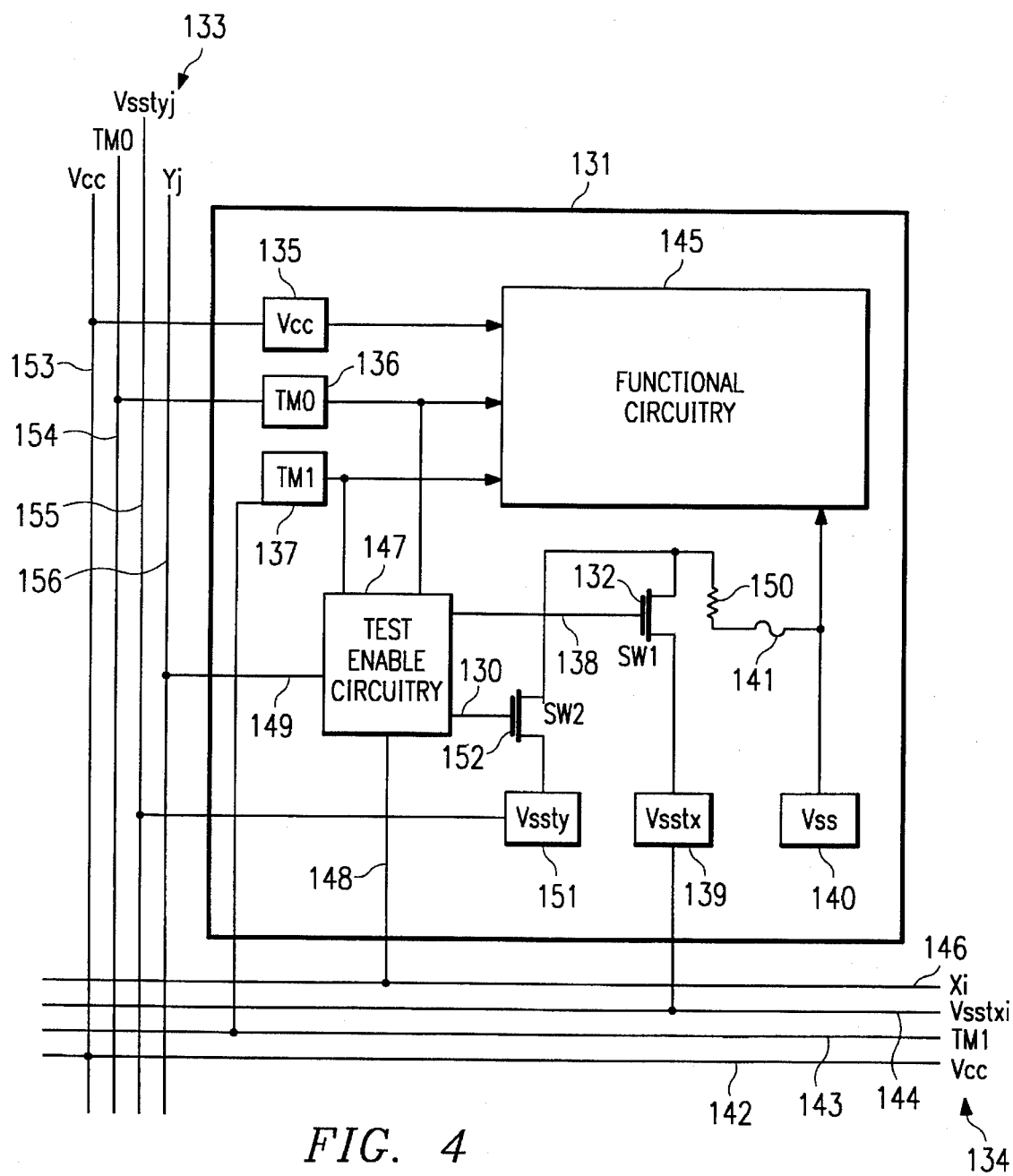
FIG. 4 is an integrated memory circuit according to a second embodiment of the present invention.

FIG. 4 shows an integrated circuit die 131 in its form when present on a wafer of semiconducting material. On the wafer, near the die 131, buses 133 and 134 run in the "scribe line" adjacent to the die, and have lines connected with input pads 135, 136, 137, 139 and 151 of the die 131. Die 131 also includes functional circuit 145 which, according to this example, is a memory circuit such as a static random access memory (SRAM), along with test enable circuitry 147 connected to external conducting lines and coupled to the functional circuitry.

A first input pad 135, labeled Vcc in FIG. 4, is connected to a first vertical conducting line 153, labeled Vcc, and supplies the Vcc voltage to functional circuitry 145. Second 136 and third 137 input pads, labeled TM0 and TM1 in FIG. 4, are respectively connected to a second vertical conducting line 154 and to a first horizontal conducting line 143, and both are connected to internal circuitry 145. Pads 136 and 137 are also connected to a first and a second input of the test enable circuitry 147. A third and a fourth input, 148 and 149, of the test enable circuitry 147 are connected respectively to a second horizontal conducting line 146, labeled Xi, and to a third vertical conducting line 156, labeled Yj. A first output 138 of the test enable circuitry 147 is connected to control terminal of a first n-channel switching transistor 132, labeled SW1. Source terminal of transistor SW1 is connected to input pad 139, labeled Vsstx, which is connected to a third horizontal conducting line 144, labeled Vsstxi. Drain terminal of transistor SW1 is coupled, by means of a serial connection of a resistor 150 and a fuse 141, to input pad 140, labeled Vss, which supplies the Vss voltage to internal circuitry 145 during normal operation of the integrated circuit. A second output 130 of the test enable circuitry 147 is connected to control terminal of a second n-channel switching transistor 152, labeled SW2. Source terminal of transistor SW2 is connected to input pad 151, labeled Vssty, which is connected to a fourth vertical conducting line 155, labeled Vsstyj. Drain terminal of transistor SW2 is connected to the drain terminal of the first switching transistor SW1.

The four possible status of the two test mode input signals TM0 and TM1 and the corresponding conditions of functional circuitry 145 are substantially the same as for the circuit of FIG. 1 described above, and are summarized in the following table:

| TM0 | TM1 | Status |
| --- | --- | --- |
| 0 | 0 | Test (deselect all array) |
| 0 | 1 | Test (Write all 1's) |
| 1 | 0 | Test (Write all 0's) |
| 1 | 1 | Normal operation |

In operation, the first output 138 of the test enable circuitry 147 is at a high level when at least one of the two test mode input signals TM0 and TM1 is low and when the first test enable signal Xi, on its input 148, is high. In this condition the switch transistor SW1 is on and the supply voltage Vsstxi, applied to pad 139 through the horizontal conductive line 144, reaches the pad 140 and the internal circuitry 145. The second output 130 of the test enable circuitry 147 is at a high level when at least one of the two test mode input signals TM0 and TM1 is low and when the second test enable signal Yi, on its input 149, is high. In this condition the second switch transistor SW2 is on and the supply voltage Vsstxj, applied to pad 151 through the vertical conductive line 155, reaches the pad 140 and the internal circuitry 145.

If both test mode input signals TM0 and TM1 are low, the integrated circuit is in normal operation mode and both switch transistors SW1 and SW2 are off so that pad 140 is electrically isolated from pads 139 and 151. In this condition, in fact, the memory circuit is supplied by the Vss pad 140 and the test supply pads Vsstx and Vssty must be isolated from the functional circuitry.

Fuse 141 is blown for faulty dies, during a brief testing of each die before starting the first phase of the parallel test of all dies, to isolate faulty dies from the rest of the wafer. Each die is first tested individually (or a few at a time in the test modes) to verify they operate correctly with no high current or short circuits. If a high current path is present for a die, its fuse 141 is blown to disconnect the integrated circuit of that die from the other dies on the wafer.

As before, resistor 150 is preferably a low value resistor placed in series with the test power supplies Vsstx and Vssty and is used to limit the maximum current consumed by the die in the case that the die goes into a high current mode during the test. This resistor can limit the current to, as an example, 30 mA.

Figure 5:
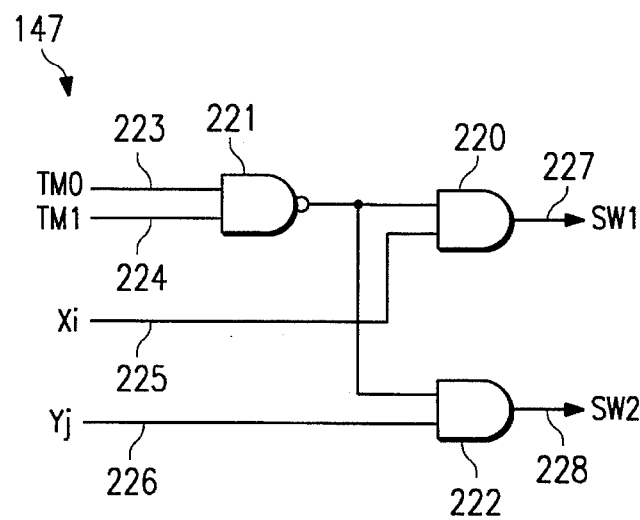
FIG. 5 is an electrical diagram, in schematic form, of a test enable circuitry used in the integrated memory circuit of FIG. 4.

FIG. 5 shows an electrical diagram, in schematic form, of the test enable circuitry 147 used in the integrated memory circuit 131 of FIG. 4. This logic circuit has four inputs and two outputs. A first 223 and a second 224 input, on which are applied the two test mode control signals TM0 and TM1, are connected with a first and a second input of a NAND gate 221, whose output is connected to a first input of a first AND gate 220 and to a first input of a second AND gate 222. A third 225 and a fourth 226 input of the test enable circuitry 147, on which are applied the first Xi and the second Yj test enable input signals, are connected respectively to a second input of the AND gate 220 and to a second input of the AND gate 222. The outputs of the two AND gates 220 and 222 are the outputs 227 and 228 of the test enable circuitry 147. The circuit of FIG. 5, whose outputs are connected to control terminals of switching transistors SW1 and SW2, allows, while in wafer test mode, to identify and eventually disconnect a single die from the other dies currently under test, in the case that an high current event is revealed in that particular die, as explained below.

As can be seen in FIG. 4, horizontal and vertical scribe buses 133 and 134 contain each four conductive lines. A positive power supply line Vcc runs in both vertical 153 and horizontal 142 conductive lines. One vertical line 154 carries the signal TM0, while one horizontal line 143 carries the signal TM1. Signals TM0 and TM1, which in this embodiment run one in the horizontal direction and one in the vertical direction, could also run both in both directions. Each horizontal scribe line has a separate horizontal test power supply, showed in FIG. 4 as Vsstxi for the generic "ith" row of dies, while each vertical scribe line has a separate vertical test power supply, showed in FIG. 4 as Vsstyj for the generic "jth" column of dies. In this way each die is supplied by the positive power supply Vcc and by a unique combination of test power supplies Vsstx and Vssty.

When, during the test, a high current is detected on multiple rows and columns, based on monitoring the current flowing in Vsstx and Vssty lines, it is possible to identify the bad die by lowering, for each intersection i,j of test enable lines, one of the two test enable signals Xi or Yj. If, for example, the Xi signal is brought low, this causes the transistor SW1 to be off and the functional circuitry to be supplied, through transistor SW2, by Vssty supply line. If the current flowing in Vssty line significantly increases, the i-j die is faulty, but if the current flowing in the Vssty line doesn't change, then the i-j die is good and another die, at a different i,j intersection, is drawing the high current.

When a faulty die has been identified at a particular i,j position, it is important to permanently isolate that die from the other dies under test. A first solution for permanent disabling a die is to blow the fuse 141 by way of a laser. In this way the power supply path of the functional circuitry 145 inside the integrated circuit is interrupted and every high current path is avoided.

Figure 6:
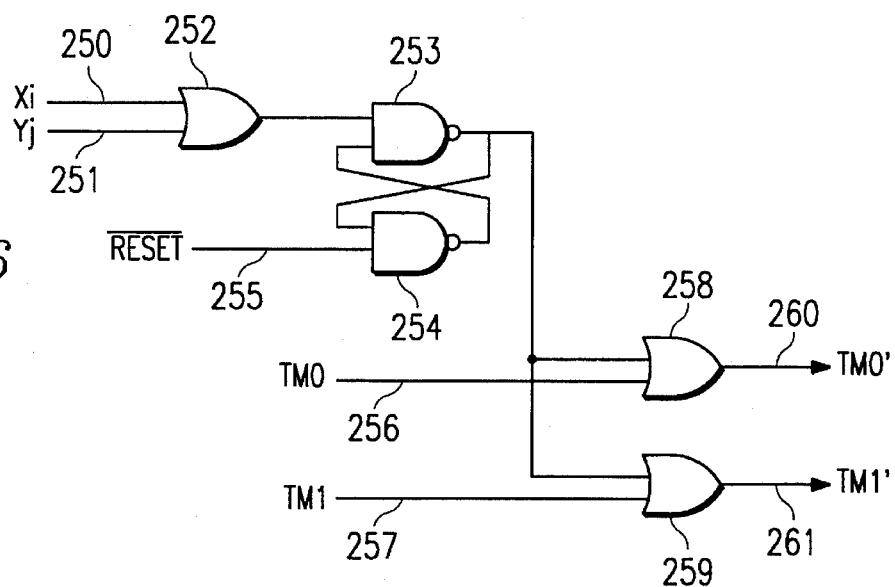
FIG. 6 is an electrical diagram, in schematic form, of a latch circuit use to force in a disabled state the integrated memory circuit of FIG. 4.

A second solution utilizes a buffer circuit, shown in FIG. 6, driven by the Xi and Yj signals, that forces and maintains the die in a disabled state. This circuit operates as a buffer for the test mode signals TM0 and TM1, is placed on the die or preferably in the scribe line present between dies, and is electrically connected between the conductive lines carrying the signals TM0 and TM1 and the test mode inputs of the functional circuitry. The buffer is controlled by the test enable signals Xi and Yj and by a reset signal used to eventually reset a latch circuit present in the buffer circuit. Test mode signal TM0 and TM1 are applied to first inputs, 256 and 257, of two OR gates, 258 and 259, whose outputs, 260 and 261, are the outputs of the buffer and are labeled in FIG. 4 as TM0' and TM1'. These two signals are applied to the test mode inputs of the functional circuitry 145 of FIG. 4. Second inputs of the OR gates 258 and 259 are connected together and to an output of a latch circuit. The latch is a conventional set-reset flip-flop circuit realized by two NAND gates, 253 and 254, connected in a classical flip-flop configuration. A SET input of the flip-flop is connected to an output of an OR gate 252, whose inputs 250 and 251 are coupled to the two signals Xi and Yj. A RESET input of the flip-flop receives a reset_bar signal that can be useful to reset the output of the flip-flop to a predetermined state.

The reset_bar signal can be another input bussed in the scribe line or can be easily generated, through a simple circuit, by proper sequencing of the Xi and Yj signals. For example, a reset pulse can be generated if the signal Xi is brought high first followed by, after a predetermined delay, the signal Yj going high. For normal operation, signal Yj may be brought high first to disable the reset pulse.

Figure 7:
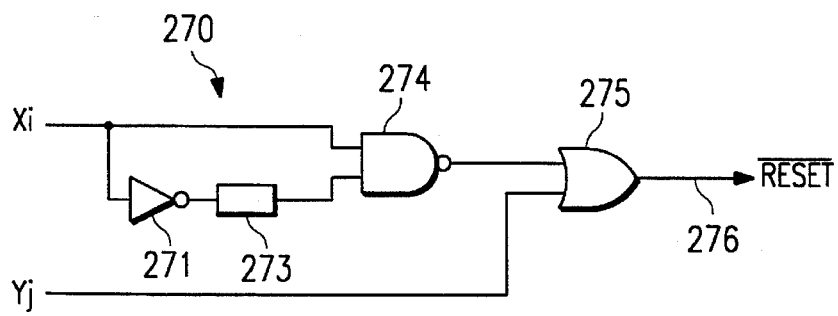
FIG. 7 is an electrical diagram, in schematic form, of a circuit for generating a reset signal used by the latch circuit of FIG. 6.

FIG. 7 shows a circuit 270 for generating such a reset_bar signal. The first test enable signal Xi is applied to a first input of a NAND gate 274 and, by means of a series of an inverting gate 271 and a delay block 273, to a second input of the same NAND gate 274. An output of the NAND gate 274 is connected to a first input of an OR gate 275. A second input of the OR gate 275 receives the second test enable signal Yj, while an output 276 of the OR gate 275 is the output 276 of the circuit 270. On this output is generated the reset_bar signal.

Figure 8:
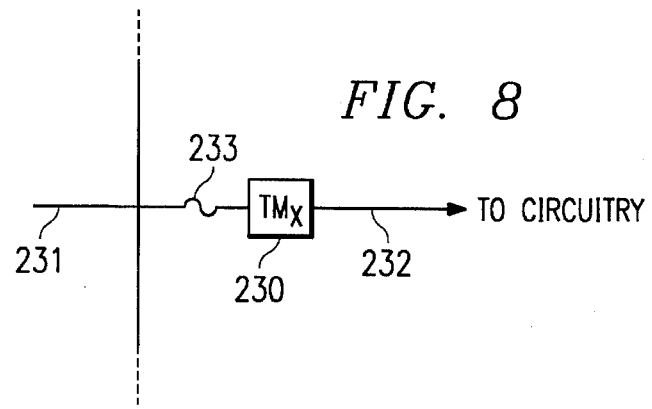
FIG. 8 is a circuit diagram illustrating a first test mode pin circuit according to the present invention.
Figure 9:
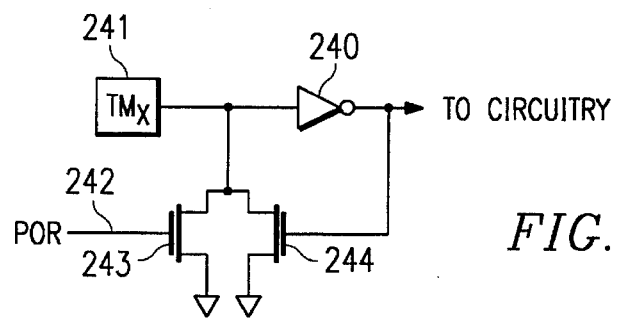
FIG. 9 is a circuit diagram illustrating a second test mode pin circuit according to the present invention.

As shown in FIG. 8, if necessary, the generic test mode input pad 230, which receives a generic test mode input signal TMx (i.e. either TM0 or TM1), can be disconnected from the connective line 231 blowing a fuse 233. As shown in FIG. 9, pad 241 may be forced inactive by a simple circuit having an inverter gate 240 with a feedback transistor 244 and, for larger security, also by a pull-down transistor 243 driven by a Power On Reset signal (POR, pulses high on power up), normally present in most memory circuits. This assures that a short circuit between any of the conductive lines and the substrate will not jeopardize normal operation of the integrated circuit. The two test mode input pads TM0 and TM1 can also be bonded to ground or to power supply voltage Vcc, during bonding of all pads of the die with the external pins of the package, to be sure that the logic levels on these two input lines are fixed to enable normal operation of the device.

It is possible also, at the end of the test of the entire wafer, to blow all fuses placed in series with switching transistors on all dies, to be sure that each the test power supply input, extending to the edge of each die is isolated from the functional circuitry.

Figure 10:
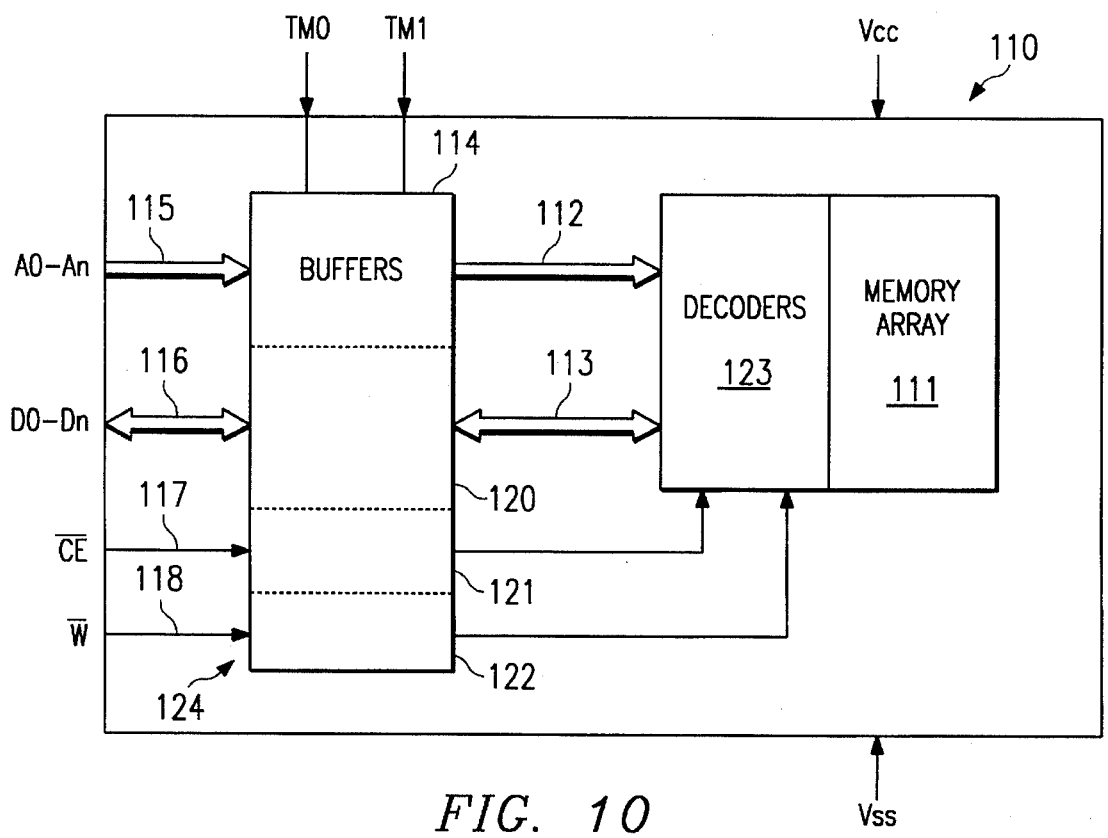
FIG. 10 is a schematic diagram of an integrated memory device, in accordance with this invention.

FIG. 10 illustrates an example of a memory circuit 110 integrated on an integrated circuit die according to the present invention. Integrated memory circuit 110 is a static random access memory (SRAM), powered by power supply inputs Vcc and Vss, having its memory cells in memory array 111. Memory cells in memory array 111 are arranged in rows and columns, not shown in figure. It should be noted that the designation of rows and columns in memory 110 use the term row to refer to the array direction in which a plurality of memory cells is selected by way of a wordline. The term column is used in this description to refer to the array direction in which one or more of the memory cells in the selected row are selected for read or write access. It is contemplated that such use of the terms rows and columns is consistent with the general understanding in the art.

Memory cells are selected by row and column decoders 123. These decoders are controlled by an internal address bus 112 exiting from address buffer 114. The address buffer 114 receives on its input the external address bus 115 on which are present the address signals A0-An. Data buffer 120 is used to transfer data to and from the memory array through the two-way data busses 113 and 116, during read and write cycles. Two logic signals, chip-enable (CE bar) and write enable (W bar), pass respectively through the buffers 121 and 122. All these buffers 114, 120, 121 and 122, indicated globally by the reference 124 in the figure, are controlled by two external signals, TM0 and TM1. From these two signals it is possible, during testing of the integrated circuit, to enter special test operation modes and to force the outputs of buffers 114 to predetermined logic values. By applying different logic signals to the input terminals TM0 and TM1 it is possible, for example, to select all row and column decoders, and to contemporaneously write predetermined data into the whole array of memory cells. It is also possible, through the same inputs, to deselect all row and column decoders.

Figure 11:
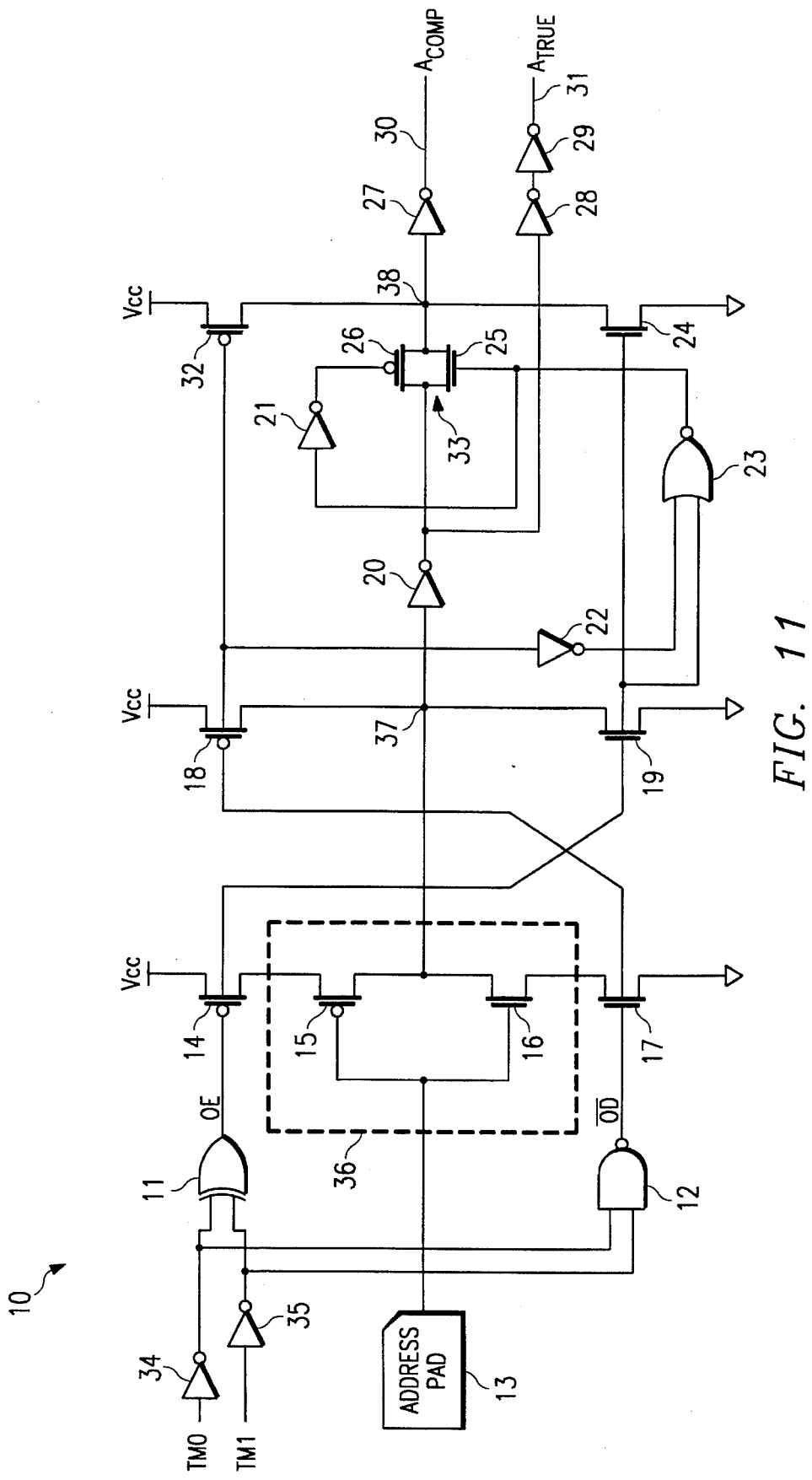
FIG. 11 is an electrical diagram, in schematic form, of an address buffer according to the preferred embodiment of the invention.

FIG. 11 is an electrical diagram illustrating a circuit 10 for an address buffer 114 according to the present invention. First inverter 36 is composed of an n-channel transistor 16 and a p-channel transistor 15 that receives address pad 13 at their gates. Second inverter 20, third inverter 28 and fourth inverter 29 are connected in series between the output of first inverter 36 and a first output signal line 31, labeled $A_{TRUE}$. The source terminal of transistor 15 is connected to a pull-up p-channel transistor 14 which is driven by a signal, labeled OE, exiting from the output of an EXOR gate 11. The source terminal of transistor 16 is connected to a pull-down n-channel transistor 17 which is driven by a signal, labeled OD bar, exiting from the output of a NAND gate 12. The two inputs of the EXOR gate 11, connected together with the two inputs of the NAND gate 12, receive two test mode input signals TM0 and TM1, inverted by two inverters 34 and 35. The Node 37, common to the output of the first inverter 36 and to the input of second inverter 20, is connected to a pull-up p-channel transistor 18, driven by the signal OD bar, and to a pull-down n-channel transistor 19, driven by the signal OE.

Pass gate 33 is connected to the output of the second inverter 20. Fifth inverter 27 is connected between the output of pass gate 33 and second output signal line 30, labeled $A_{COMP}$. In the preferred embodiment, $A_{TRUE}$ and $A_{COMP}$ are input into an address decoder (not shown).

As known in the art, pass gate 33 is composed of an n-channel transistor 25 and a p-channel transistor 26 with a common source and drain. The signal used to control pass gate 33 comes from the output of a NOR gate 23. The signal OD bar is applied to a first input of the NOR gate 23, while the signal OE is applied, by means of a sixth inverting gate 22, to a second input of the NOR gate 23. The output terminal of the NOR gate 23 is connected directly to the gate of the n-channel transistor 25 and, by means of a seventh inverting gate 21, to the gate of the p-channel transistor 26.

The node 38, common to the output of the pass gate 33 and to the input of the fifth inverter 27, is connected to a pull-up p-channel transistor 32, driven by the signal OD bar, and to a pull-down n-channel transistor 24, driven by the signal OE.

As an example of normal operation of the address buffer 10, if both the signals TM0 and TM1 are high, the output of the EXOR gate 11 (signal line labeled OE) is low, while the output of the NAND gate 12 (signal line labeled OD bar), is high. This condition causes both the pull-up transistor 14 and the pull-down transistor 17 to be on, so that the signal present on the address pad 13 is inverted by the first inverter 36 and reaches the node 37. The pull-up and pull-down transistors 18 and 19, connected to the node 37 are both off, so the signal present on node 37 is inverted by the second inverter 20 and reaches pass gate 33. The pass gate 33, driven by the gates 22 and 23, in this condition is on so that the signal present on its input can pass to its output 38. The pull-up and pull-down transistors 32 and 24, connected to the node 38 are both OFF, so the signal present on this node is inverted by the fifth inverter 27 and reaches the second output signal line 30, labeled $A_{COMP}$. The signal present on the output of the second inverter 20 reaches also, by means of a third and a fourth inverter 28 and 29, the first output signal line 31, labeled $A_{TRUE}$. Inverters 28 and 29 are used to increase drive capacity for the signal $A_{TRUE}$. In this condition of normal operation, thus, on the first output signal line 31, labeled $A_{TRUE}$, is present a signal corresponding to the input signal present on the address pad 13, while on the second output signal line 30, labeled $A_{COMP}$, is present a signal complementary to the input signal present on the address pad 13.

For a first example of a test mode operation of the address buffer 10, if the signal TM0 is low and the signal TM1 is high, the output of the EXOR gate 11 (signal line labeled OE) is high, and the output of the NAND gate 12 (signal line labeled OD bar) is high. This condition causes the pull-up transistor 14 to be off and the pull-down transistor 17 to be on. In this condition the inverter 36 does not work as an inverter and its output is forced low by the pull-down transistor 19, which is turned on by the signal OE. The pull-up transistor 18, connected to the node 37 and driven by the signal OD bar, is off. The logic low signal present on node 37 becomes, by means of the three inverters in series 20, 28 and 29, a logic high signal on the first output signal line 31, labeled $A_{TRUE}$. In this condition, the pass gate 33, driven by the gates 22 and 23, is off and node 38 is forced low by the pull-down transistor 24 which is turned on by the signal OE. The pull-up transistor 32, connected to the node 38 and driven by the signal OD bar, is OFF. The logic low signal present on node 38 becomes, by means of the inverter 27, a logic high signal on the second output signal line 30, labeled $A_{COMP}$. Therefore, in this condition, both outputs $A_{TRUE}$ and $A_{COMP}$ of the address buffer are high. This means that if the address decoders, which have $A_{TRUE}$ and $A_{COMP}$ as inputs, are composed of NAND gates, and these NAND gates are used to select rows and columns in a memory array, then all of the NAND gates have a low voltage level on their outputs. This causes all of the rows and columns in the memory array to be selected in this first test mode.

The second test mode operation of the address buffer is selected by the signal TM0 high and the signal TM1 low. In this condition both the output of the EXOR gate 11 (signal line labeled OE), and the output of the NAND gate 12 (signal line labeled OD bar), are high. This condition causes the pull-up transistor 14 to be off and the pull-down transistor 17 to be on. The inverter 36 does not work as an inverter and its output is forced low by the pull-down transistor 19 which is turned on by the signal OE. The pull-up transistor 18, connected to the node 37 and driven by the signal OD bar is off. The logic low signal present on node 37 becomes, by means of the three inverters in series 20, 28 and 29, a logic high signal on the first output signal line 31, labeled $A_{TRUE}$. The pass gate 33, driven by the gates 22 and 23, is off and node 38 is forced low by the pull-down transistor 24 which is turned on by the signal OE. The pull-up transistor 32, connected to the node 38 and driven by the signal OD bar is off. The logic low signal present on node 38 becomes, by means of the inverter 27, a logic high signal on the second output signal line 30, labeled $A_{COMP}$. Therefore, also in this second test mode condition, both outputs $A_{TRUE}$ and $A_{COMP}$ of the address buffer are high. This means that if the address decoders, which have $A_{TRUE}$ and $A_{COMP}$ as inputs, are composed of NAND gates, and these NAND gates are used to select rows and columns in a memory array, then all of the NAND gates have a low voltage level on their outputs. This causes all of the rows and columns in the memory array to also be selected in this second test mode.

The third test mode operation of the address buffer is selected by both signals TM0 and TM1 low. In this condition the output of the EXOR gate 11 (signal line labeled OE) is low, and the output of the NAND gate 12 (signal line labeled OD bar) is low. This condition causes the pull-down transistor 17 to be off. The inverter 36 does not work as an inverter and its output is forced high by the pull-up transistor 18 which is turned on by the signal OD bar. The pull-down transistor 19, connected to the node 37 and driven by the signal OE is off. The logic high signal present on node 37 becomes, by means of the three inverters in series 20, 28 and 29, a logic low signal on the first output signal line 31, labeled $A_{TRUE}$. The pass gate 33, driven by the gates 22 and 23, is off and node 38 is forced high by the pull-up transistor 32 which is turned on by the signal OD bar. The pull-down transistor 24, connected to the node 38 and driven by the signal OE bar is off. The logic high signal present on node 38 becomes, by means of the inverter 27, a logic low signal on the second output signal line 30, labeled $A_{COMP}$. Therefore, in this third test mode condition, both outputs $A_{TRUE}$ and $A_{COMP}$ of the address buffer are low. This means that if the address decoders, which have $A_{TRUE}$ and $A_{COMP}$ as inputs, are composed of NAND gates, and these NAND gates are used to select rows and columns in a memory array, then all of the NAND gates have a high voltage level on their outputs. This causes all of the rows and columns in the memory array to be deselected in this third test mode.

Figure 12:
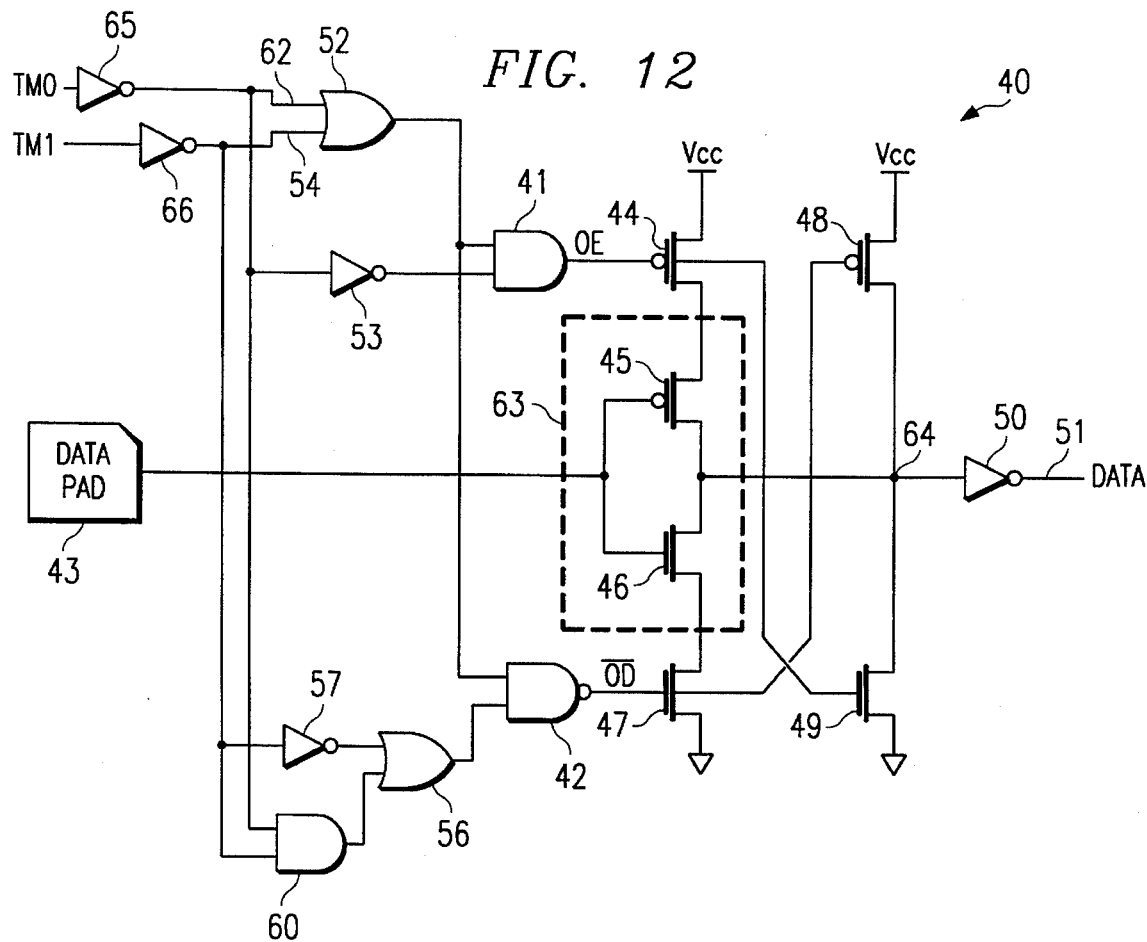
FIG. 12 is an electrical diagram, in schematic form, of a data buffer according to the preferred embodiment of the invention.

FIG. 12 is an electrical diagram illustrating a circuit 40 for a data buffer according to the present invention. A first inverter 63, composed of an n-channel transistor 46 and a p-channel transistor 45 with common gates and a second inverter 50 are connected in series between a data pad 43 and an output signal line 51, labeled DATA. The source terminal of transistor 45 is connected to a pull-up p-channel transistor 44 which is driven by a signal, labeled OE, exiting from the output of a first AND gate 41. The source terminal of transistor 46 is connected to a pull-down n-channel transistor 47 which is driven by a signal, labeled OD bar, exiting from the output of a NAND gate 42. A first input of the first AND gate 41, connected together with a first input of the NAND gate 42, receive an output signal from a first OR gate 52, whose inputs are connected to the input lines 62 and 54 on which are present the two "Test mode" input signals TM0 and TM1, inverted by two inverters 65 and 66. A second input of the first AND gate 41 is connected, by means of a third inverting gate 53, to the input line 62 on which is present the input signal TM0. A second input of the NAND gate 42 is connected to the output of a second OR gate 56, whose first input is connected, by means of a fourth inverter gate 57, to the input line 54 on which is present the input signal TM1. A second input of the second OR gate 56 is connected to the output of a second AND gate 60, whose inputs are connected to the input lines 62 and 54 on which are present the two input signals TM0 and TM1.

The node 64, common to the output of the first inverter 63 and to the input of second inverter 50, is connected to a pull-up p-channel transistor 48, driven by the signal OD bar, and to a pull-down n-channel transistor 49, driven by the signal OE.

As an example of normal operation of the data buffer 40, if both the signals TM0 and TM1 are high, the logic gates 52, 53 and 41 generate a logic signal low on the signal line labeled OE, and the logic gates 56, 57, 60 and 42 generate a logic signal high on the signal line labeled OD bar. This condition causes both the pull-up transistor 44 and the pull-down transistor 47 to be on, so that the signal present on the data pad 43 is inverted by the first inverter 63 and reaches the node 64. The pull-up and pull-down transistors 48 and 49, connected to the node 64, are both off, so the signal present on node 64 is inverted by the second inverter 50 and reaches the output signal line 51, labeled DATA. In this condition of normal operation, a signal corresponding to the input signal present on the data pad 43 is present on the output signal line 51, labeled DATA.

For a first example of a test mode operation of the data buffer 40, if the signal TM0 is low and the signal TM1 is high, the logic gates 52, 53 and 41 generate a logic signal high on the signal line labeled OE, and the logic gates 56, 57, 60 and 42 generate a logic signal high on the signal line labeled OD bar. This condition causes the pull-up transistor 44 to be off and the pull-down transistor 47 to be on. In this condition the inverter 63 does not work as an inverter and its output, on node 64, is forced low by the pull-down transistor 49 which is turned on by the signal OE. The pull-up transistor 48, connected to the node 64 and driven by the signal OD bar is off. The logic low signal present on node 64 becomes, by means of the second inverter 50, a logic high signal on the output signal line 51, labeled DATA. In this first test mode condition is present a logic signal high on the output signal line 51, labeled DATA. Since all rows and columns are selected in this first test mode, as described above, a "one" data state is written into all memory cells currently selected by address decoders in this first test mode.

As noted above, the second test mode operation of the data buffer 40 is selected by the signal TM0 high and the signal TM1 low. In this condition the logic gates 52, 53 and 41 generate a logic signal low on the signal line labeled OE, and the logic gates 56, 57, 60 and 42 generate a logic signal low on the signal line labeled OD bar. This condition causes the pull-up transistor 44 to be on and the pull-down transistor 47 to be off. In this condition the inverter 63 does not work as an inverter and its output, on node 64, is forced high by the pull-up transistor 48 which is turned on by the signal OD bar. The pull-down transistor 49, connected to the node 64 and driven by the signal OE, is off. The logic high signal present on node 64 becomes, by means of the second inverter 50, a logic low signal on the output signal line 51, labeled DATA. In this second test mode condition, thus, on the output signal line 51, labeled DATA, is present a logic signal low. Since all rows and columns are selected in this second test mode, a "zero" is written into all memory cells currently selected by address decoders.

The third test mode operation of the data buffer 40 is selected by both signals TM0 and TM1 low. In this condition the logic gates 52, 53 and 41 generate a logic signal low on the signal line labeled OE, and the logic gates 56, 57, 60 and 42 generate a logic signal low on the signal line labeled OD bar. The data buffer is in a condition equivalent to the second test mode operation and the output signal line 51, labeled DATA, is forced to a low level. Therefore in this third test operation mode all rows and columns are deselected by address decoders precluding data from being written into any memory cells and the buffer is maintained in a defined state.

Figure 13:
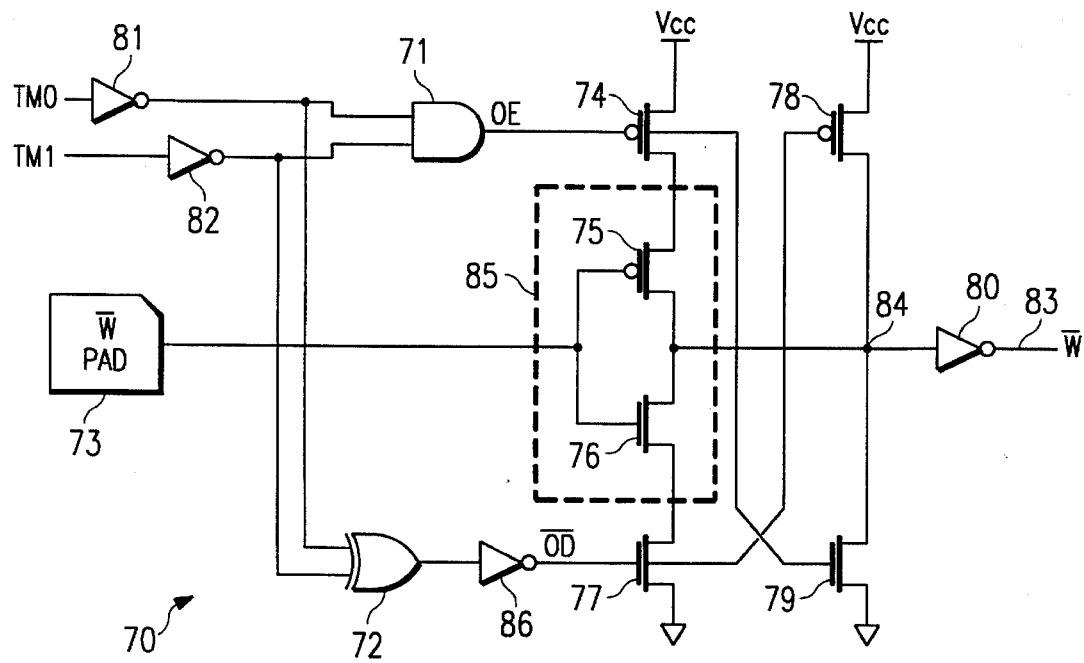
FIG. 13 is an electrical diagram, in schematic form, of a signal buffer according to the preferred embodiment of the invention.

FIG. 13 is an electrical diagram illustrating a circuit 70 for a signal buffer according to the present invention. This signal buffer is used, according to the present invention, to buffer signals W bar and CE bar used respectively to enable write cycles and to enable chip operation, as these two signals are both active low and require the same kind of buffer. Therefore, while in FIG. 13 the input pad and the output signal line are labeled "W bar", the same circuit can be used for the Chip Enable signal "CE bar".

The signal buffer circuit 70 has a first inverter 85, composed of an n-channel transistor 76 and a p-channel transistor 75 with common gates, and a second inverter 80 connected in series between an input pad 73 and an output signal line 83, labeled W bar. The source terminal of transistor 75 is connected to a pull-up p-channel transistor 74 which is driven by a signal, labeled OE, exiting from the output of an AND gate 71. The source terminal of transistor 76 is connected to a pull-down n-channel transistor 77 which is driven by a signal, labeled OD bar, exiting from the output of a third inverting gate 86, whose input is connected to the output of an EXOR gate 72. The two inputs of the AND gate 71, connected together with the two inputs of the EXOR gate 72, receive the two test mode input signals TM0 and TM1, inverted by two inverters 81 and 82. The node 84, common to the output of the first inverter 85 and to the input of second inverter 80, is connected to a pull-up p-channel transistor 78, is driven by the signal OD bar, and is connected to a pull-down n-channel transistor 79, driven by the signal OE.

As an example of normal operation of the signal buffer 70 of FIG. 13, if both the signals TM0 and TM1 are high, the AND gate 71 generates a logic signal low on the signal line labeled OE, and the EXOR gate 72 generates a logic signal low on its output which, inverted by the third inverter 86, becomes a logic signal high on the signal line labeled OD bar. This condition causes both the pull-up transistor 74 and the pull-down transistor 77 to be on, so that the signal present on the signal pad 73 is inverted by the first inverter 85 and reaches the node 84. The pull-up and pull-down transistors 78 and 79, connected to the node 84, are both off, so the signal present on node 84 is inverted by the second inverter 80 and reaches the output signal line 83, labeled W bar. In this condition of normal operation, thus, a signal corresponding to the input signal present on the signal pad 73 is present on the output signal line 83, labeled W bar.

For a first example of a test mode operation of the signal buffer 70, if the signal TM0 is low and the signal TM1 is high, the AND gate 71 generates a logic signal low on the signal line labeled OE, and the EXOR gate 72 generates a logic signal high on its output which, inverted by the third inverter 86, becomes a logic signal low on the signal line labeled OD bar. This condition causes the pull-up transistor 74 to be on and the pull-down transistor 77 to be off. In this condition the inverter 85 does not work as an inverter and its output, on node 84, is forced high by the pull-up transistor 78 which is turned on by the signal OD bar. The pull-down transistor 79, connected to the node 84 and driven by the signal OE, is off. The logic high signal present on node 84 becomes, by means of the second inverter 80, a logic low signal on the output signal line 83, labeled W bar. In this first test mode condition, thus, a logic signal low is present on the output signal line 83, labeled W bar. Since all rows and columns are selected in this mode, and since data buffer 40 is driving a logic "one" state, a "one" data state is written into all memory cells selected by address decoders in this first test mode.

The second test mode operation of the data buffer 40 is selected by the signal TM0 high and the signal TM1 low. In this condition the AND gate 71 generates a logic signal low on the signal line labeled OE, and the EXOR gate 72 generates a logic signal low on the signal line labeled OD bar. The signal buffer is in a condition equivalent to the first test mode operation and the output signal line 83, labeled W bar, is forced to a low level. This means that memory is enabled to start a "write cycle". In this test mode, as described, all rows and columns are selected, and data buffer 40 is driving a "zero" level, to write a "zero" into all cells simultaneously.

The third test mode operation of the signal buffer 40 is selected by both signals TM0 and TM1 low. In this condition the AND gate 71 generates a logic signal high on the signal line labeled OE, and the EXOR gate 72 generates a logic signal high on the signal line labeled OD bar. This condition causes the pull-up transistor 74 to be off and the pull-down transistor 77 to be on. In this condition the inverter 85 does not work as an inverter and its output, on node 84, is forced low by the pull-down transistor 79, which is turned on by the signal OE. The pull-up transistor 78, connected to the node 84 and driven by the signal OD bar, is off. The logic low signal present on node 84 becomes, by means of the second inverter 80, a logic high signal on the output signal line 83, labeled W bar. In this third test mode condition, thus, on the output signal line 83, labeled W bar, is present a logic signal high that disables writing in all memory array.

A method for stress testing a plurality of dies on a single silicon wafer, each of the plurality integrating a memory circuit that incorporates the above described circuits, will now be described. Each die of the wafer is first tested briefly individually (or a few at a time) in the test modes to verify they operate correctly with no high current or short circuits. If a high current path is found on one die, the fuse placed in series with the switching transistor is blown and the circuit integrated on that die is disconnected from other dies on the wafer.

Figure 14:
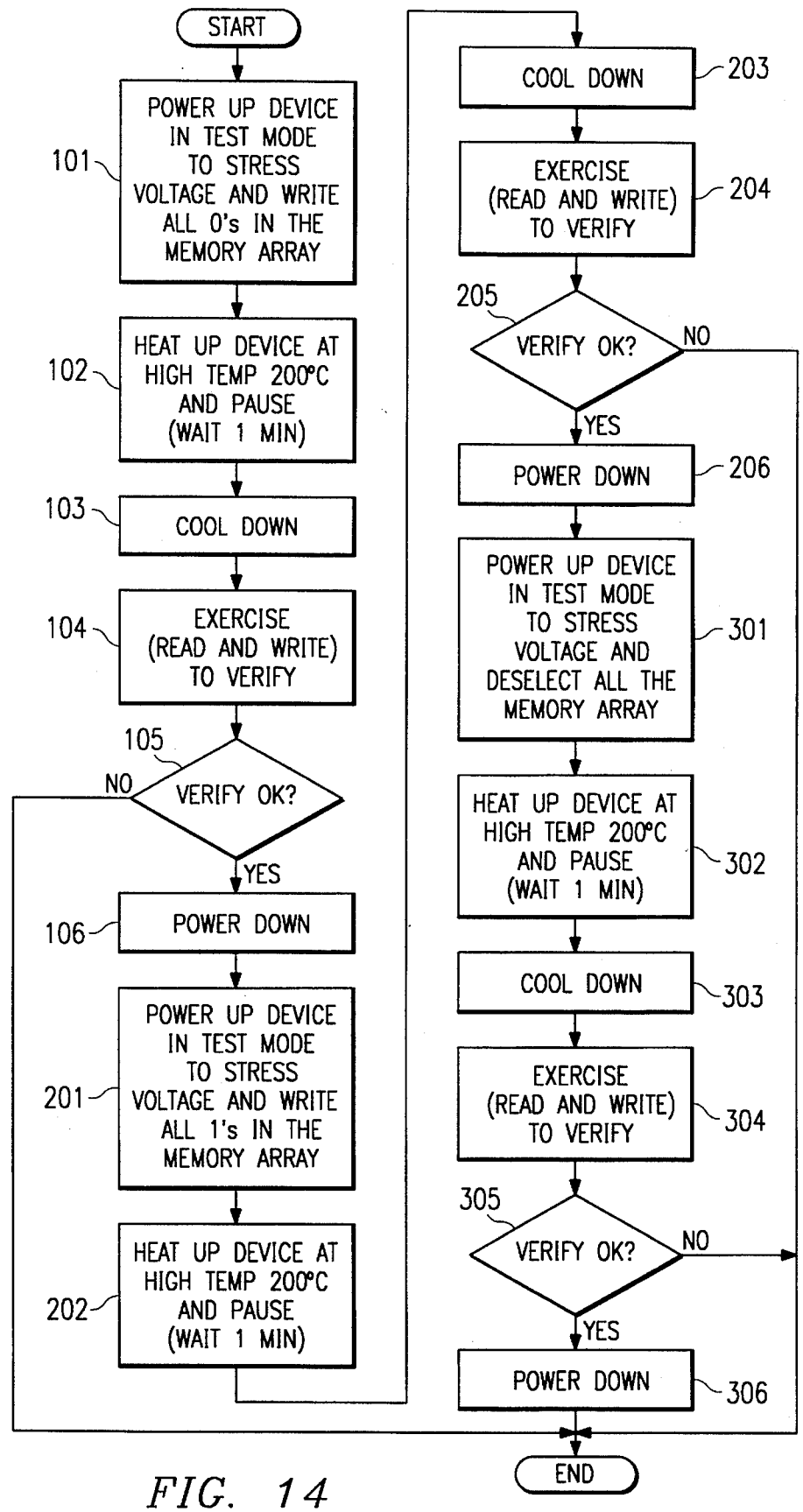
FIG. 14 is a flow chart of a test method according to the present invention.

FIG. 14 shows a flow chart of the stress test method. The test is described referring to a single memory device integrated on a single die because all other dies on the wafer are controlled in parallel simultaneously in the same way by controlling the two signals TM0 and TM1. According to the preferred embodiment of the invention, one stress test cycle consists of three test phases, each test phase defined by the combination of test mode control signals TM0 and TM1 and corresponding to one test operation mode explained above and shown in the following table:

| TM0 | TM1 | Status |
| --- | --- | --- |
| 0 | 1 | First Test Mode (Write all 1's in memory) |
| 1 | 0 | Second Test Mode (Write all 0's in memory) |
| 0 | 0 | Third Test Mode (deselect all memory array) |

During all three phases of the test, the particular architecture of the power supply lines that run in the horizontal and vertical scribe lines, above described in detail, and that supply all the integrated circuits under test, allow continous monitoring of the current consumed by each die. In fact each die is supplied by a unique combination of vertical and horizontal power supply lines. If, during one phase of the test, a high current is detected in one or more dies, the faulty dies can be disconnected from other dies on the wafer by means of the test enable circuitry described above. The test enable circuitry is controlled by two test enable signals, one running horizontally and one running vertically in the scribe lines adjacent to the die, by means of which it is possible to enable or disable the test mode on individual dies in the array. When test mode is disabled, any faulty dies are marked as faulty die and are discarded.

The first phase of the test starts by powering up the integrated memory circuit to a stress voltage, e.g. 7 Volt, which is higher than the normal operation voltage of the device. This power up is done while the first test mode control signal TM0 is maintained low and the second test mode control signal TM1 is maintained high. As has been explained above, this combination of test mode control signals forces all outputs of address buffers high to select of all rows and columns in the array of memory cells, forces all outputs of data buffers high, and forces outputs of the two signal buffers for signals "write enable" and "chip enable" low. This situation causes a parallel writing of all memory cells in the array with logic "ones". This operation does not require, as in conventional devices, separate control of all address, data and control pads, but only requires control of two signals, TM0 and TM1. This means an effective reduction of test time and of complexity of test probes and test equipment. During this first step, shown in FIG. 13 as process 101, the bitline loads are disabled.

The next step, shown by process 102, is to heat up the integrated memory circuit to a high temperature, e.g. 200°–250° C. and to pause for a certain amount of time, seconds up to several minutes. The stress condition, maintained on the memory array during process 102, allows test for ionic contamination or charge trap sites. This is allowed by the greater mobility of ions at high temperatures and their tendency to drift (or be attracted) based on an electric field.

Then, in process 103, exited test mode, the device is cooled down and, in process 104, is exercised by writing and reading each memory cell individually, or by bytes or words, to identify any and all failures in the memory array. This particular process 104 cannot be made simultaneously on all dies on the wafer and is made singularly, on a different tester station, on each single die. If this verify step of process 105 fails, the device is discarded (or indicated as a failure on the wafer) and the stress test ends. If, otherwise, the verify step is passed, the device is powered down in process 106, ending the first phase of the stress test.

The second phase of the stress test starts by again powering up the integrated memory circuit to the same stress voltage while the first test mode control signal TM0 is maintained high and the second test mode control signal TM1 is maintained low. As has been explained above, this combination of test mode control signals forces all outputs of address buffers high to select all rows and columns in the array of memory cells, forces all outputs of data buffers low, and forces outputs of the two signal buffers for signals "write enable" and "chip enable" low. This situation causes a parallel writing of all memory cells in the array with logic "zeroes". This operation, as in first stress test phase, does not require controlling all address, data and control pads, but requires control of only the two test mode signals TM0 and TM1. During this first step, is shown in FIG. 13 as process 201, the bitline loads are disabled.

The next step, shown as process 202, is to heat up the integrated memory circuit to a high temperature, e.g. 200°–250° C. and to pause for a certain amount of time, seconds up to several minutes. The stress condition, maintained on the memory array during process 202, allows test for ionic contamination or charge trap sites. This is allowed by the greater mobility of ions at high temperatures and their tendency to drift (or be attracted) based on an electric field.

Then, in process 203, the device is cooled down and, in process 204, exited test mode, is exercised by writing and reading each memory cell individually, or by bytes or words, to determining if any of the memory cells in the array are now failures. This verify process 204 cannot be made simultaneously on all dies on the wafer and is made singularly, on a different tester station, on each single die. If this verify step of process 205 fails, the device is identified as a failure and the stress test ends. If, otherwise, the verify step is passed, the device is powered down in step 206 ending the second phase of the stress test.

The third and last phase of the stress test starts by again powering up the integrated memory circuit to the same stress voltage, while the first and the second test mode control signals TM0 and TM1 are maintained low. As explained above, this combination of test mode control signals forces all outputs of address buffers low to deselect of all rows and columns in the array of memory cells, forces all outputs of data buffers low, and forces outputs of the two signal buffers for signals "write enable" and "chip enable" high. In this situation all rows and columns are deselected, writing is disabled, and the "high" chip enable signal causes the disabling of most circuits inside the integrated memory circuit. This operation, as well as in other stress test phases, does not require controlling of all address, data and control pads, but of only the two test mode signals TM0 and TM1. This first step is shown in FIG. 13 as process 301.

Next step, shown as process 302, is to heat up the integrated memory circuit to a high temperature, i.e. 200°–250° C. and to pause for a certain amount of time, seconds up to several minutes. The stress condition, maintained on the memory array during process 302, allows test for ionic contamination or charge trap sites. This is allowed by the greater mobility of ions at high temperatures and their tendency to drift (or be attracted) based on an electric field.

Then, in process 303, the device is cooled down and, in process 304, exited test mode, is exercised by writing and reading each memory cell individually, or by bytes or words, to determine if any portion of the memory is now inoperable. This verify process 304 cannot be made simultaneously on all dies on the wafer and is made singularly, on a different tester station, on each single die. If this verify step of process 305, fails the device is identified as a failure and the stress test ends. If, otherwise, the verify step is passed, the device is powered down in process 306, ending the stress test.

In order to enhance oxide stressing, it is possible to perform an additional oxide stress step, after the steps of cooling down the device (processes 103, 203 and 303), and before exiting the test mode and exercising memory cells individually (processes 104, 204 and 304). This step can be performed in all three described phases, or only in one or two of them, performed by cooling the device to a medium temperature, for example 80° C., raising the supply voltage to a higher stress voltage, for example 9 Volts, and maintaining these conditions for a limited time, for example one second. This step is believed to improve the stress of all oxides in the integrated circuit.

The above described method for parallel stress testing of integrated circuit dies, together with the above described circuits, provides a method for detecting latent defects within the memory array as well as within decoders and periphery circuits. DC conditions of the test, compared to traditional dynamic testing at elevated temperature, reduce latchup phenomena and allows test for ionic contamination or charge trap sites. This is allowed by the greater mobility of ions at high temperatures and their tendency to drift (or be attracted) based on a constant electric field.

Furthermore, the stress test described above saves time because it performs, at wafer level, a complete stress test that would otherwise be done, singularly, in a burn in on packaged devices. All of the stress test can be performed in less than several minutes, or even few seconds, instead of the several hours (such as 96 hours for a 1 Megabyte SRAM) necessary for a singular conventional burn in test. Finally, the test equipment is also simplified because, during the test, all the integrated circuit dies are controlled by only four pads, two for power supply and two for controlling different test operation modes.

Although the method has been described by applying the three phases in such order, writing all zeroes in the memory array, writing all ones in the memory array and then deselect all memory array, other combination or subsets of the three test phases may be used. For example the sequencing of the test phase may be altered as follows, first deselect all memory array and then write into the memory array all zeroes and then all ones.

In addition, the stress time, the stress voltage applied to the integrated circuit and the temperature are related parameters, and they can vary between certain limits. For example longer time at higher voltage may allow reduced temperature or higher voltage at higher temperature may allow reduced time.

Finally, the verification processes may all be done at the end of all three test phases, so that these three phases can be done on the same simple test station. Indeed the verification process has to be done on a different tester station that permits to read and write single cells, or bytes or words, in the memory arrays of single dies, controlling any address and data signals in normal operation mode.

In other words the method described above may be changed to meet the needs of the user.

While the invention has been particularly shown and described with reference to a preferred embodiment, it will be understood by those skilled in the art that various changes in form and detail may be made therein without departing from the spirit and scope of the invention.

I claim:

1. An integrated circuit die having a normal operation mode and at least one special test operation mode comprising:

functional circuitry;

test enable logic circuitry;

a first test mode control input line extending to the edge of the die, coupled to the functional circuitry and to the test enable logic circuitry, for receiving a first test mode control signal;

a first and a second test enable input line extending to the edge of the die, for receiving a first and a second test enable signal, coupled to the test enable logic circuitry;

a power supply input line, coupled to the functional circuitry, for providing a power supply voltage thereto, extending to the edge of the die;

a test power supply input line extending to the edge of the die, for receiving a test power supply voltage; and a switching transistor, having a conduction path connected on one end to the test power supply input and coupled on another end to the functional circuitry, and having a control terminal coupled to an output of the test enable logic circuitry, for applying the test power supply voltage to the functional circuitry responsive to the first test mode control input receiving the first test mode control signal and to the first and second test enable input lines receiving the first and the second test enable signals.

2. The integrated circuit of claim 1 further comprising a second test mode control input line extending to the edge of the die, coupled to the functional circuitry and to the test enable logic circuitry, for receiving a second test mode control signal; and wherein the switching transistor applies the test power supply voltage to the functional circuitry responsive to the first and the second test mode control inputs receiving the first and the second test mode control signals and to the first and the second test enable input lines receiving the first and the second test enable signals.

3. The integrated circuit of claim 2 wherein the test enable logic circuitry comprises:

a first, a second and a third logic gate, each logic gate having a first and a second input and an output; and wherein the first input of the first logic gate is connected to the first test mode control input, the second input of the first logic gate is connected to the second test mode control input, and the output of the first logic gate is connected to the first input of the second logic gate; the first input of the third logic gate is connected to the first test enable input line, the second input of the third logic gate is connected to the second test enable input line, and the output of the third logic gate is connected to the second input of the second logic gate; the output of the second logic gate is connected to the control terminal of the switching transistor.

4. The integrated circuit of claim 3 wherein the first logic gate is a NAND gate, the second logic gate is an AND gate and the third logic gate is an OR gate.

5. The integrated circuit of claim 2 further comprising a third fuse connected between the second test mode control input line and the functional circuitry.

6. The integrated circuit of claim 2 wherein the test mode control input lines, the test enable input lines, the power supply input lines and the test power supply input lines are connected to like input lines of others of a plurality of integrated circuits on the same wafer.

7. The integrated circuit of claim 1 wherein the switching transistor is an n-channel MOS transistor.

8. The integrated circuit of claim 1 further comprising a first fuse connected in series with the conduction path of the switching transistor between the functional circuitry and the test power supply input.

9. The integrated circuit of claim 1 further comprising a resistive element connected in series with the conduction path of the switching transistor between the functional circuitry and the test power supply input.

10. The integrated circuit of claim 1 further comprising a second fuse connected between the first test mode control input line and the functional circuitry.

11. The integrated circuit of claim 1, wherein the first test mode control input line, the test enable input lines, the power supply input lines and the test power supply input lines are connected to like input lines of others of a plurality of integrated circuits on the same wafer.

12. An integrated circuit die having a normal operation mode and at least one special test operation mode comprising:

functional circuitry;

test enable logic circuitry;

a first test mode control input line extending to the edge of the die, coupled to the functional circuitry and to the test enable logic circuitry, for receiving a first test mode control signal;

a first and a second test enable input line extending to the edge of the die, for receiving a first and a second test enable signal, coupled to the test enable logic circuitry;

a power supply input line, coupled to the functional circuitry, for providing a power supply voltage thereto, extending to the edge of the die;

a first test power supply input line extending to the edge of the die, for receiving a first test power supply voltage;

a second test power supply input line extending to the edge of the die, for receiving a second test power supply voltage;

a first switching transistor, having a conduction path connected on one end to the first test power supply input and coupled on another end to the functional circuitry, and having a control terminal coupled to a first output of the test enable logic circuitry, for applying the first test power supply voltage to the functional circuitry responsive to the first test mode control input receiving the first test mode control signal and to the first test enable input line receiving the first test enable signal; and a second switching transistor, having a conduction path connected on one end to the second test power supply input and coupled on another end to the functional circuitry, and having a control terminal coupled to a second output of the test enable logic circuitry, for applying the second test power supply voltage to the functional circuitry responsive to the first test mode control input receiving the first test mode control signal and to the second test enable input line receiving the second test enable signal.

13. The integrated circuit of claim 12 further comprising a second test mode control input line extending to the edge of the die, coupled to the functional circuitry and to the test enable logic circuitry, for receiving a second test mode control signal;

wherein the first switching transistor applies the first test power supply voltage to the functional circuitry responsive to the first and the second test mode control inputs receiving the first and the second test mode control signals and to the first test enable input line receiving the first test enable signal; and wherein the second switching transistor applies the second test power supply voltage to the functional circuitry responsive to the first and the second test mode control inputs receiving the first and the second test mode control signals and to the second test enable input line receiving the second test enable signal.

14. The integrated circuit of claim 13 wherein the test enable logic circuitry comprises:

a first, a second and a third logic gate, each logic gate having a first and a second input and an output; and wherein the first input of the first logic gate is connected to the first test mode control input, the second input of the first logic gate is connected to the second test mode control input, and the output of the first logic gate is connected to the first input of the second logic gate and to the first input of the third logic gate; the second input of the second logic gate is connected to the first test enable input line, the second input of the third logic gate is connected to the second test enable input line, the output of the second logic gate is connected to the control terminal of the first switching transistor and the output of the third logic gate is connected to the control terminal of the second switching transistor.

15. The integrated circuit of claim 14 wherein the first logic gate is a NAND gate and the second and the third logic gates are AND gates.

16. The integrated circuit of claim 13 further comprising a third fuse connected between the second test mode control input line and the functional circuitry.

17. The integrated circuit of claim 13 wherein the test mode control input lines, the test enable input lines, the power supply input lines and the test power supply input lines are connected to like input lines of others of a plurality of integrated circuit dies on the same wafer.

18. The integrated circuit of claim 13, further comprising a buffer circuit, between the test mode control input lines and the functional circuitry, said buffer circuit comprising a latch circuit and having a first and a second input connected to the first and the second test mode control input lines, a third and a fourth input connected to the first and the second test enable input lines, a reset input for receiving a reset signal, and a first and a second output connected to corresponding inputs of the functional circuitry: and wherein said buffer circuit forces and maintains, by means of the latch circuit, the first and the second test mode control input of the functional circuitry to predetermined logic states.

19. The integrated circuit of claim 18 wherein the reset signal applied to the reset input of the buffer circuit is generated by properly sequencing the logic states of the two test enable signals present on test enable input lines.

20. The integrated circuit of claim 18 wherein the buffer circuit is integrated on a portion of silicon substrate separate by the portion on which is integrated the integrated circuit.

21. The integrated circuit of claim 12 wherein the first and the second switching transistors are n-channel MOS transistors.

22. The integrated circuit of claim 12 further comprising a first fuse connected in series with the conduction path of at least one of the two switching transistors between the functional circuitry and one of the test power supply inputs.

23. The integrated circuit of claim 12 further comprising a resistive element connected in series with the conduction path of at least one of the switching transistors between the functional circuitry and one of the test power supply inputs.

24. The integrated circuit of claim 12 further comprising a second fuse connected between the first test mode control input line and the functional circuitry.

25. The integrated circuit of claim 12, wherein the first test mode control input line, the test enable input lines, the power supply input lines and the test power supply input lines are connected to like input lines of others of a plurality of integrated circuits on the same wafer.

26. A method for stress testing a plurality of integrated circuits, integrated on a silicon wafer and arranged in rows and columns, each integrated circuit having a test enable circuit, a power supply input and a first input of the test enable circuit connected to like inputs of others of the plurality of integrated circuits by way of conductive lines running in a first direction between the integrated circuits, a test power supply input and a second input of the test enable circuit connected to like inputs of others of the plurality of integrated circuits by way of conductive lines running in a second direction between the integrated circuits, comprising the steps of:

monitoring the current consumed by each of the plurality of integrated circuits by monitoring the current flowing in conductive lines used to supply the integrated circuits;

disabling each integrated circuit on which is detected an abnormal high current in the monitoring step; and applying a stress voltage to the conductive lines running in the first and in the second direction associated with the power supply input and the test power supply input.

27. The method of claim 26 wherein the step of applying a stress voltage to the conductive lines running in the first and in the second direction associated with the power supply input and the test power supply input is performed during the steps of monitoring the current consumed by each of the plurality of integrated circuits and of disabling each integrated circuit on which is detected an abnormal high current in the monitoring step.

28. The method of claim 26 wherein the step of disabling each integrated circuit on which is detected an abnormal high current in the monitoring step comprises blowing a fuse connected in series with the test power supply input line.

29. The method of claim 26 wherein the step of disabling each integrated circuit on which is detected an abnormal high current in the monitoring step comprises controlling, from the conductive lines running in the first and in the second direction, the first and the second inputs of the test enable circuit.

30. The method of claim 26 wherein the plurality of integrated circuits includes all integrated circuits integrated on a silicon wafer.

31. The method of claim 26 wherein the plurality of integrated circuits includes part of the integrated circuits integrated on a silicon wafer.

32. A method for stress testing a plurality of integrated circuits, integrated on a silicon wafer and arranged in rows and columns, each integrated circuit having a test enable circuit, a first and a second test mode input connected to conductive lines running between the integrated circuits, a power supply input, a first test power supply input and a first input of the test enable circuit connected to like inputs of others of the plurality of integrated circuits by way of conductive lines running in a first direction between the integrated circuits, a second test power supply input and a second input of the test enable circuit connected to like inputs of others of the plurality of integrated circuits by way of conductive lines running in a second direction between the integrated circuits, comprising the steps of:

monitoring the current consumed by each of the plurality of integrated circuits by monitoring the current flowing in conductive lines running in the first and in the second direction connected with the first and the second test power supply inputs;

disabling each integrated circuit on which is detected an abnormal high current in the monitoring step; and applying a stress voltage to the conductive lines running in the first and in the second direction associated with the power supply input and the test power supply input.

33. The method of claim 32 wherein the step of disabling each integrated circuit on which is detected an abnormal high current in the monitoring step comprises blowing a fuse connected in series with the test power supply input line.

34. The method of claim 32 wherein the step of disabling each integrated circuit on which is detected an abnormal high current in the monitoring step comprises controlling, from the conductive lines running in the first and in the second direction, the first and the second inputs of the test enable circuit.

35. The method of claim 32 wherein the step of disabling each integrated circuit on which is detected an abnormal high current in the monitoring step comprises setting a latch circuit coupled between the test mode control inputs and the relative conductive lines to force and maintain the first and the second test mode control input to a predetermined logic state.

36. The method of claim 35 further comprising resetting the latch circuit by sequencing signals applied to first and the second inputs of the test enable circuit.

37. The method of claim 32 wherein the plurality of integrated circuits includes all integrated circuits integrated on a silicon wafer.

38. The method of claim 32 wherein the plurality of integrated circuits includes part of the integrated circuits integrated on a silicon wafer.

39. A silicon wafer including:

a plurality of dies arranged in rows and columns on which are integrated a plurality of integrated circuits, each integrated circuit having functional circuitry, test enable logic circuitry, a switching transistor and control inputs extending to the edge of the die, and operable in a normal operation mode and at least one special test operation mode:

control lines running between the dies and connected to corresponding control inputs of some of the plurality of integrated circuits for applying control signals to the integrated circuits for enabling and controlling the at least one special test operation mode; and test power supply lines running between the dies and connected to corresponding control inputs of some of the plurality of integrated circuits, for receiving a test power supply voltage on each test power supply line;

wherein each switching transistor has a conduction path connected on one end to one of the test power supply lines and coupled on another end to the functional circuitry, and having a control terminal coupled to an output of the test enable logic circuitry, for applying the test power supply voltages to the functional circuitry responsive to the corresponding control inputs receiving corresponding control signals.

* * * * *